(12) United States Patent
Nguyen et al.

(10) Patent No.: US 11,031,075 B2
(45) Date of Patent: Jun. 8, 2021

(54) HIGH BANDWIDTH REGISTER FILE CIRCUIT WITH HIGH PORT COUNTS FOR REDUCED BITLINE DELAY

(71) Applicant: QUALCOMM Incorporated, San Diego, CA (US)

(72) Inventors: Hoan Huu Nguyen, Cary, NC (US); Francois Ibrahim Atallah, Raleigh, NC (US); Keith Alan Bowman, Morrisville, NC (US); Jihoon Jeong, Cary, NC (US)

(73) Assignee: Qualcomm Incorporated, San Diego, CA (US)

( * ) Notice: Subject to any disclaimer, the term of this patent is extended or adjusted under 35 U.S.C. 154(b) by 0 days.

(21) Appl. No.: 16/406,749

(22) Filed: May 8, 2019

(65) Prior Publication Data
US 2020/0357462 A1 Nov. 12, 2020

(51) Int. Cl.
*G11C 11/419* (2006.01)
*G11C 11/418* (2006.01)

(52) U.S. Cl.
CPC ......... *G11C 11/419* (2013.01); *G11C 11/418* (2013.01)

(58) Field of Classification Search
CPC ...... G11C 11/419; G11C 11/418; G11C 11/41
See application file for complete search history.

(56) References Cited

U.S. PATENT DOCUMENTS

| | | | | |
|---|---|---|---|---|
| 6,104,642 A | * | 8/2000 | Blomgren | G06F 5/015 365/189.02 |
| 8,867,303 B2 | * | 10/2014 | Hu | G11C 7/1075 365/233.1 |
| 9,772,903 B2 | * | 9/2017 | Kulkarni | G06F 11/0751 |
| 2004/0085847 A1 | * | 5/2004 | Atallah | G11C 8/08 365/230.06 |
| 2004/0139271 A1 | * | 7/2004 | Khellah | G06F 9/30141 711/1 |
| 2014/0032980 A1 | * | 1/2014 | Kulkarni | G06F 11/1008 714/48 |
| 2015/0279438 A1 | * | 10/2015 | Kulkarni | G11C 7/22 365/96 |
| 2018/0342289 A1 | * | 11/2018 | Kulkarni | G11C 7/12 |
| 2019/0080737 A1 | * | 3/2019 | Nguyen | G06F 13/1684 |
| 2019/0295613 A1 | * | 9/2019 | Weisenbach | G11C 7/1048 |

OTHER PUBLICATIONS

Nguyen et al. ("A 7-nm 6R6W Register File With Double-Pumped Read and Write Operations for High-Bandwidth Memory in Machine Learning and CPU Processors", IEEE Solid-State Circuits Letters, Dec. 2018) (Year: 2018).*

Nguyen H., et al., "A 7nm Double-Pumped 6R6W Register File for Machine Learning Memory", 2018 Symposium on VLSI Circuits Digest of Technical Papers, 2018, pp. 15-16.

* cited by examiner

*Primary Examiner* — Mushfique Siddique
(74) *Attorney, Agent, or Firm* — Muncy, Geissler, Olds & Lowe, P.C.

(57) ABSTRACT

A high bandwidth register file circuit that significantly reduces the shared local read bitline RC delay to enable ultra-high performance PRFs with high port counts. In one example, the register file circuit includes read stack nfets in a multiplexer circuit instead of the memory cell causing the local read bitline RC to be independent of the number of read and write ports of the memory cell.

24 Claims, 13 Drawing Sheets

US 11,031,075 B2

HIGH BANDWIDTH REGISTER FILE CIRCUIT WITH HIGH PORT COUNTS FOR REDUCED BITLINE DELAY

FIELD OF DISCLOSURE

This disclosure relates generally to memory, and more specifically, but not exclusively, to on-die memory with a high bandwidth register file circuit.

BACKGROUND

Conventional high performance central processing units (CPUs) use parallel processing of instructions to achieve higher execution of instructions per cycle (IPC). High performance CPUs typically contain a large array of execution units executing in parallel to achieve high throughput. This enormous level of parallelism requires on-die memories with a high bandwidth (BW) to maintain a high-utilization rate across the execution units. Traditional approaches for improving memory BW to allow more reads and writes per clock cycle include increasing the number of bitcell read and write ports or duplicating the bitcell. These approaches significantly increase the memory area, power, and latency.

Having many instructions executing in parallel coupled with a high clock frequency is needed to achieve high IPC for high performance CPU. The physical register file (PRF) memory is critical in enabling high IPC as its number of read and write ports indicate the number of instructions that can be executed per clock cycle—the larger the number of read and write ports, the more instructions that can be issued and executed in parallel. The bitcell area, however, increases quadratically with the number of bitcell read and write ports, resulting in significantly larger local and global bitlines resistance capacitance (RC) in the PRF. This limits the maximum total number of ports in the design. Conventional approaches employ a time-multiplexed or double pumped of the bitcell read/write ports—2 read/write operations in the same access cycle to the same physical read/write port—to effectively double the number of memory read/write ports of a PRF design. This approach helps reduce port pressure in a PRF design as it dramatically decreases the overall bitcell area as well as local and global bitlines RC. However, a high frequency for PRF design with large port count is still difficult to achieve as the shared local read bitline still has a high RC delay that limits the late read access and overall frequency.

Accordingly, there is a need for systems, apparatus, and methods that significantly reduce the shared local read bitline RC delay to enable ultra-high performance PRFs with high port counts including the methods, system and apparatus provided hereby.

SUMMARY

The following presents a simplified summary relating to one or more aspects and/or examples associated with the apparatus and methods disclosed herein. As such, the following summary should not be considered an extensive overview relating to all contemplated aspects and/or examples, nor should the following summary be regarded to identify key or critical elements relating to all contemplated aspects and/or examples or to delineate the scope associated with any particular aspect and/or example. Accordingly, the following summary has the sole purpose to present certain concepts relating to one or more aspects and/or examples relating to the apparatus and methods disclosed herein in a simplified form to precede the detailed description presented below.

In one aspect, a register file circuit includes: a first memory cell coupled to a first output and a first read word line; and a multiplexer circuit coupled to the first output, a local read bitline, a first bit control line, and the first read word line, the multiplexer circuit configured to select the first output based on the local read bitline and the first read word line; wherein the multiplexer circuit comprises a first transistor coupled to the local read bitline at a source of the first transistor and the first read word line at a gate of the first transistor, and a second transistor coupled to the first bit control line at a gate of the second transistor, a ground at a drain of the second transistor, and a drain of the first transistor at a source of the second transistor.

In another aspect, a register file circuit includes: means for storing a first value coupled to a first output and a first read word line; and means for multiplexing coupled to the first output, a local read bitline, a first bit control line, and the first read word line, the means for multiplexing configured to select the first output based on the local read bitline and the first read word line; wherein the means for multiplexing comprises a first transistor coupled to the local read bitline at a source of the first transistor and the first read word line at a gate of the first transistor, and a second transistor coupled to the first bit control line at a gate of the second transistor, a ground at a drain of the second transistor, and a drain of the first transistor at a source of the second transistor.

In still another aspect, a register file circuit includes: a first memory cell coupled to a first output, a first read word line, a first input, and a first write word line; the first output coupled to a local read bitline and the first input coupled to a local write bitline; and a multiplexer circuit coupled to the first output, the local read bitline, a first bit control line, and the first read word line, the multiplexer circuit configured to select the first output based on the local read bitline and the first read word line; wherein the multiplexer circuit comprises a first transistor coupled to the local read bitline at a source of the first transistor and the first read word line at a gate of the first transistor, and a second transistor coupled to the first bit control line at a gate of the second transistor, a ground at a drain of the second transistor, and a drain of the first transistor at a source of the second transistor.

In still another aspect, a register file circuit includes: means for storing a first value coupled to a first output, a first read word line, a first input, and a first write word line; the first output coupled to a local read bitline and the first input coupled to a local write bitline; and means for multiplexing coupled to the first output, a local read bitline, a first bit control line, and the first read word line, the means for multiplexing configured to select the first output based on the local read bitline and the first read word line; wherein the means for multiplexing comprises a first transistor coupled to the local read bitline at a source of the first transistor and the first read word line at a gate of the first transistor, and a second transistor coupled to the first bit control line at a gate of the second transistor, a ground at a drain of the second transistor, and a drain of the first transistor at a source of the second transistor.

Other features and advantages associated with the apparatus and methods disclosed herein will be apparent to those skilled in the art based on the accompanying drawings and detailed description.

BRIEF DESCRIPTION OF THE DRAWINGS

A more complete appreciation of aspects of the disclosure and many of the attendant advantages thereof will be readily obtained as the same becomes better understood by reference to the following detailed description when considered in connection with the accompanying drawings which are presented solely for illustration and not limitation of the disclosure, and in which.

Figure 1A:
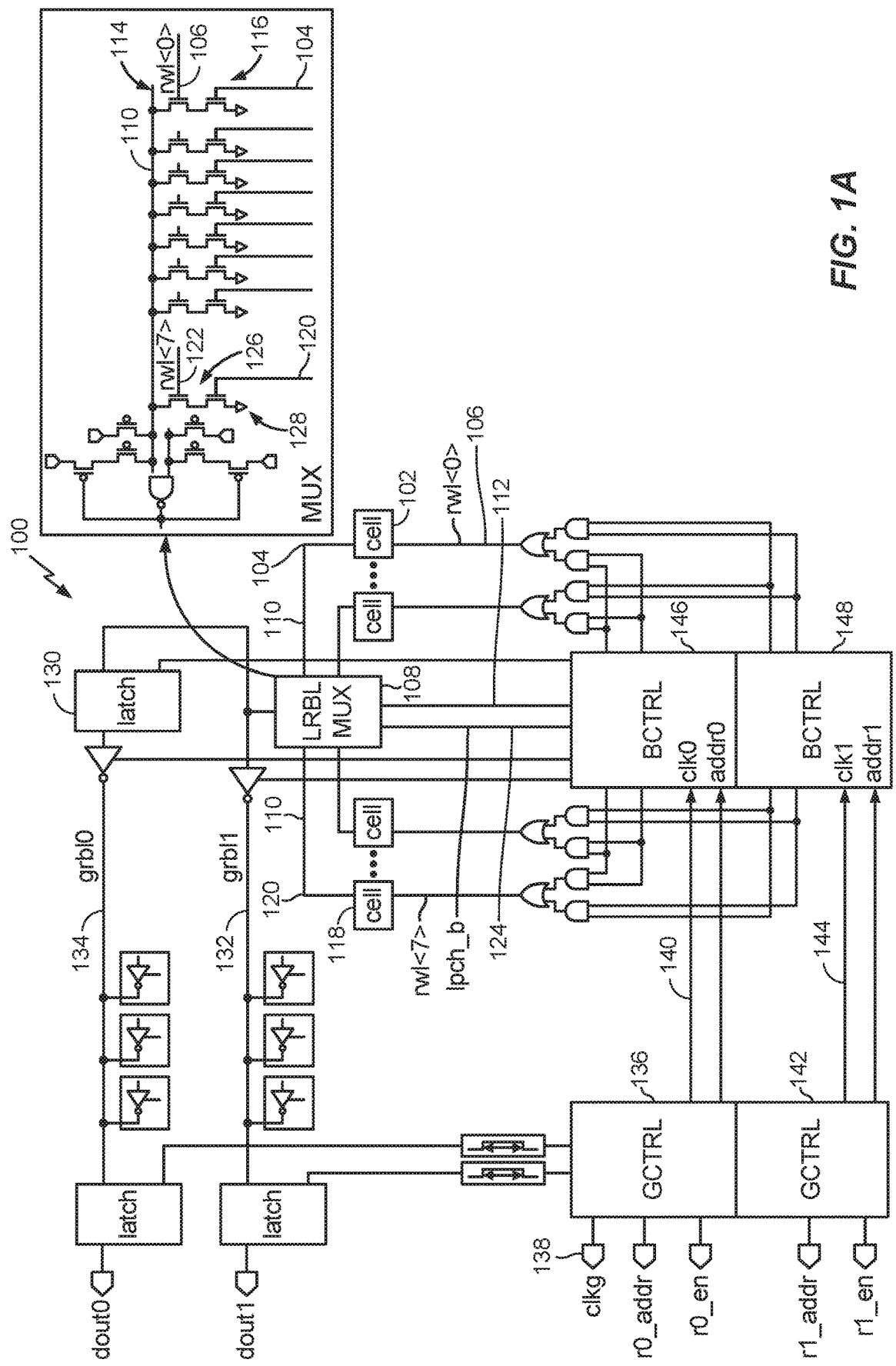
FIG. 1A illustrates an exemplary register file read circuit in accordance with some examples of the disclosure.

In accordance with common practice, the features depicted by the drawings may not be drawn to scale. Accordingly, the dimensions of the depicted features may be arbitrarily expanded or reduced for clarity. In accordance with common practice, some of the drawings are simplified for clarity. Thus, the drawings may not depict all components of a particular apparatus or method. Further, like reference numerals denote like features throughout the specification and figures.

DETAILED DESCRIPTION

The exemplary methods, apparatus, and systems disclosed herein mitigate shortcomings of the conventional methods, apparatus, and systems, as well as other previously unidentified needs.

FIG. 1A illustrates an exemplary register file read circuit in accordance with some examples of the disclosure. As shown in FIG. 1A, a register file circuit 100 may include a first memory cell 102 coupled to a first output 104 and a first read word line 106; and a multiplexer circuit 108 coupled to the first output 104, a local read bitline 110, a first bit control line 112, and the first read word line 106. The multiplexer circuit 108 may be configured to select the first output 104 based on the local read bitline 110 and the first read word line 106. The multiplexer circuit 108 may comprises a first transistor 114 coupled to the local read bitline 110 at a source of the first transistor 114 and the first read word line 106 at a gate of the first transistor 114, and a second transistor 116 coupled to the first output 104 at a gate of the second transistor 116, a ground at a drain of the second transistor 116, and a drain of the first transistor 114 at a source of the second transistor 116.

As shown in FIG. 1A, the register file circuit 100 may include more than one memory cell, such as a second memory cell 118 coupled to a second output 120 and a second read word line 122. In addition, the multiplexer circuit 108 may be coupled to the second output 120, a second bit control line 124, and the second read word line 122. The multiplexer circuit 108 may also be configured to select the second output 120 based on the local read bitline 110 and the second read word line 122 and include a third transistor 126 coupled to the local read bitline 110 at a source of the third transistor 126 and the second read word line 122 at a gate of the third transistor 126, and a fourth transistor 128 coupled to the second output 120 at a gate of the fourth transistor 128, a ground at a drain of the fourth transistor 128, and a drain of the third transistor 126 at a source of the fourth transistor 128.

To enable a more efficient double pumped operation (double read of the memory cells in one clock cycle), the multiplexer circuit 108 may also be coupled to a latch 130 and a second global read bitline 132. The latch 130 may be coupled to a first global read bitline 134. This may enable the multiplexer circuit 108 to be configured to selectively couple the first output 104 to the latch 130 and selectively couple the second output 120 to the second global read bitline 132 in a same clock cycle. This may enable the register file circuit 100 to read a first value from the first memory cell 102 and store that value in the latch 130 in the first half of the clock cycle followed by reading a second value in the second memory cell 118 during the second half of the clock cycle. As shown in FIG. 1A, the register file circuit 100 may also include additional components such as a first global control circuit 136 that inputs a global clock signal 138 and outputs a first clock signal 140, a second global control circuit 142 that inputs the global clock signal 138 and outputs a second clock signal 144, a first bit control circuit 146 that inputs the first clock signal 140 and outputs a first control bit on the first bit control line 112, and a second bit control circuit 148 that inputs the second clock signal 144 and outputs a second control bit on the second bit control line 124. The first global control circuit 136 inputs a global clock signal 138 as well as a first address (e.g., r0_addr) and a first enable signal (e.g., r0_en) and, in conjunction with the first bit control circuit 146, decodes the first read address. Similarly, the second global control circuit 142 may input a second address (e.g., r1_addr) and a second enable signal (e.g., r1_en) and, in conjunction with the second bit control circuit 148, decodes the second read address.

By shortening the local read bitline 110 compared to a conventional register file circuit, the RC value and the delay caused by the RC value are reduced thereby enabling the register file circuit 100 to read two memory cells in a single clock cycle. For example, a conventional single access register file incurs a time delay to access the first address ($t_{acc\_r0}$) is equal to the sum of a time to decode the address ($t_{dec0}$) plus the time delay caused by the RC value of the local read bitline ($t_{lrbl}$) plus the time delay caused by the RC value of the global read bit line ($t_{grbl0}$). In a double pumped operation of the register file circuit 100, the time delay to access the first address ($t_{acc\_r0}$) is equal to the sum of a time to decode the address ($t_{dec0}$) plus the time delay caused by the RC value of the local read bitline ($t_{lrbl}$) plus the time delay caused by the latch hold of the first read value ($t_{hld}$) plus the time delay caused by the RC value of the first global read bit line ($t_{grbl0}$). The time delay to access the second address ($t_{acc\_r1}$) is equal to the sum of a time to decode the address ($t_{dec1}$) plus the time delay caused by the RC value of the local read bitline ($t_{lrbl}$) plus the time delay caused by the late read while the latch holds the first read value ($t_{lrbl\_dp}$) plus the time delay caused by the RC value of the second global read bit line ($t_{grbl1}$). Since the time delay of the shortened local bitline is much less than a conventional single access register file, the time delay caused by $t_{lrbl}+t_{hld}$ and the time delay caused by $t_{lrbl}+t_{lrbl\_dp}$ is less than or equal to the time delay associated with the local bitline of a conventional single access register file. Thus, the register file circuits disclosed herein are able to read two memory cells in the same or less amount of time than a conventional register file circuit takes to read a single memory cell. This allows the effective bandwidth to double (two reads in a single clock cycle) compared to conventional designs (one read in a single clock cycle).

Figure 1B:
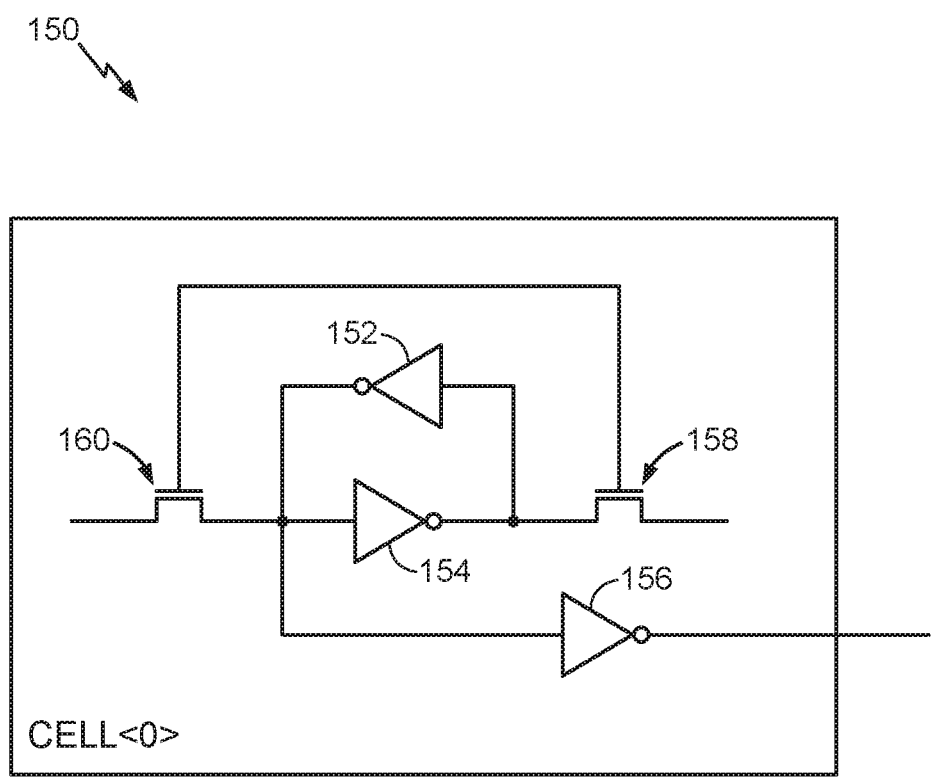
FIG. 1B illustrates an exemplary memory cell circuit in accordance with some examples of the disclosure.

FIG. 1B illustrates an exemplary memory cell circuit in accordance with some examples of the disclosure. As shown in FIG. 1B, a memory cell 150 (e.g., first memory cell 102 and second memory cell 118) may comprise a first inverter 152 coupled to a second inverter 154, a third inverter 156 coupled to the first inverter 152 and the second inverter 154, a first passgate 158 coupled to the first inverter 152, the second inverter 154, and the third inverter 156, a second passgate 160 coupled to the first passgate 158, the first inverter 152, and the second inverter 154. As shown, an output of the first inverter 152 is coupled to an input of the second inverter 154 and an input of the third inverter 156. Also, an input of the first inverter 152 is coupled to an output of the second inverter 154. The first inverter 152 and the second inverter 154 may be configured to hold a value such as a 1 (also known as a logical high) or a 0 (also known as a logical low). In addition, the first passgate 158 and the second passgate 160 may be configured to input the value and the first passgate 158, the second passgate 160, and the third inverter 156 are configured to output the value. By reducing the length of the local read bitline 110, the delay to pre-charge or evaluate the memory cell 150 is also reduced. In addition, by moving the two passgate transistors (nfet transistors) out of the memory cell, the height of the memory cell, and thus the length of the read bitline, is reduced as well as making the memory cell less dominated by nfet transistors.

Figure 2:
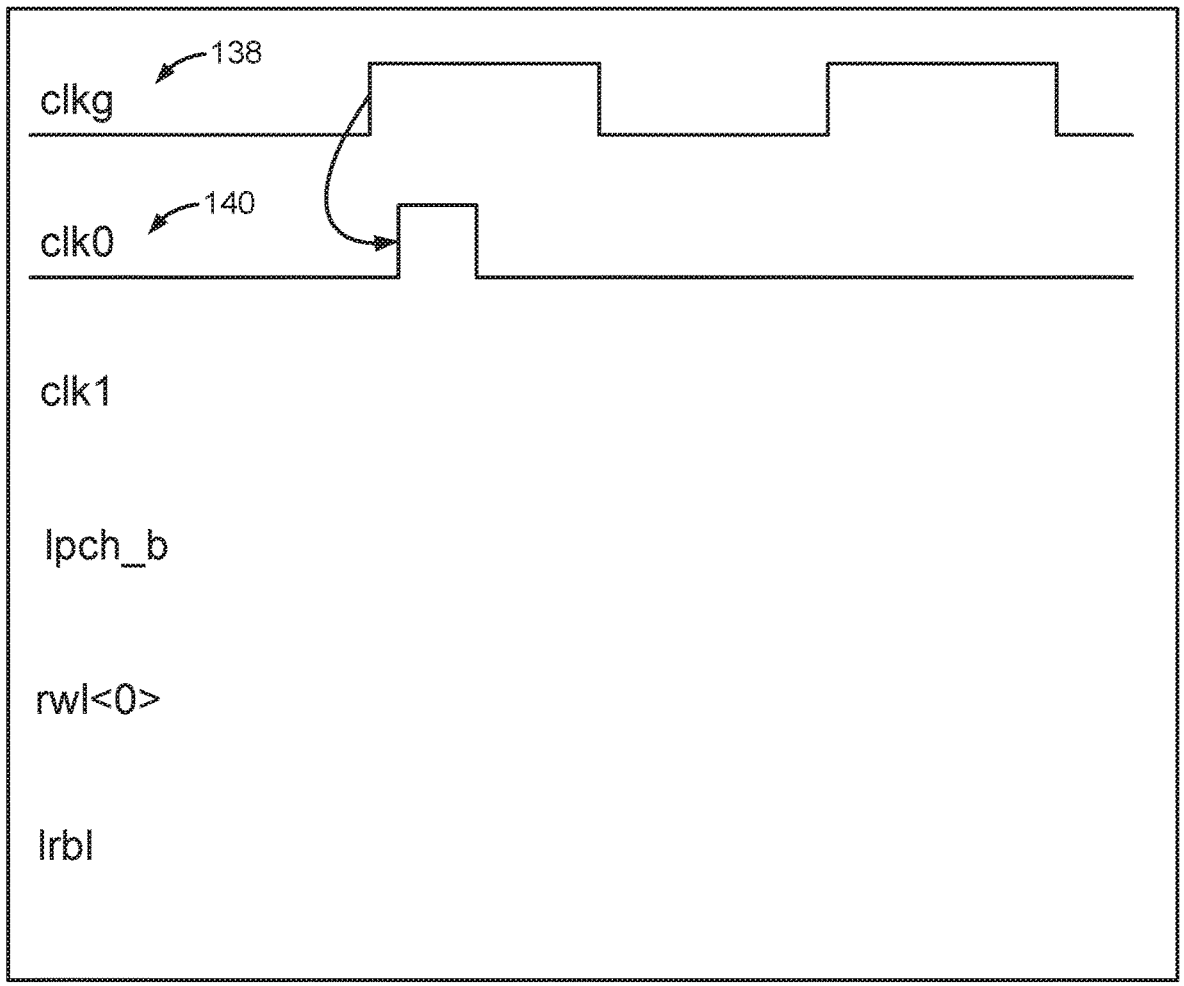
FIGS. 2-8 illustrate example timing diagrams for a register file circuit read in accordance with some examples of the disclosure.
Figure 3:
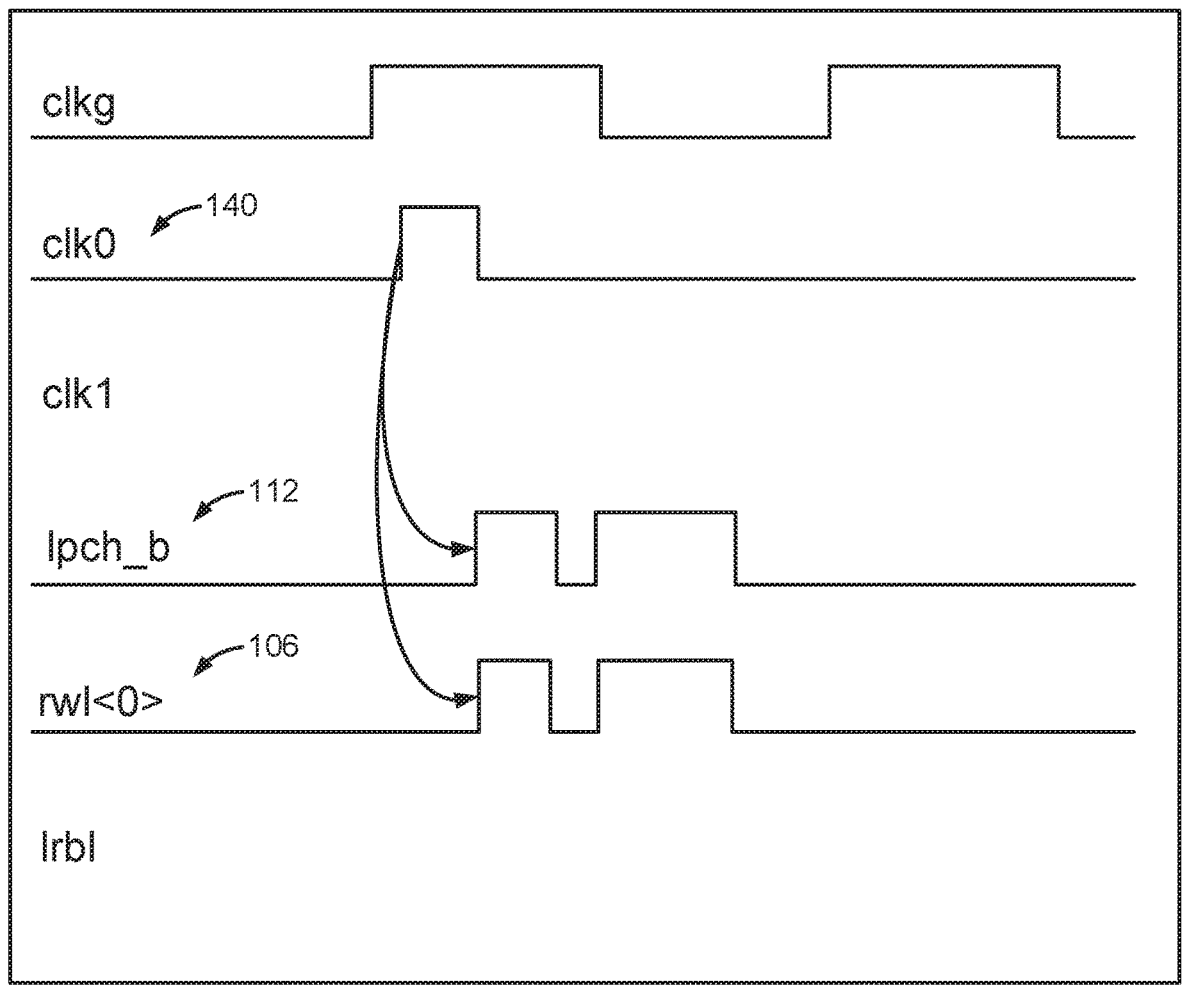
Figure 4:
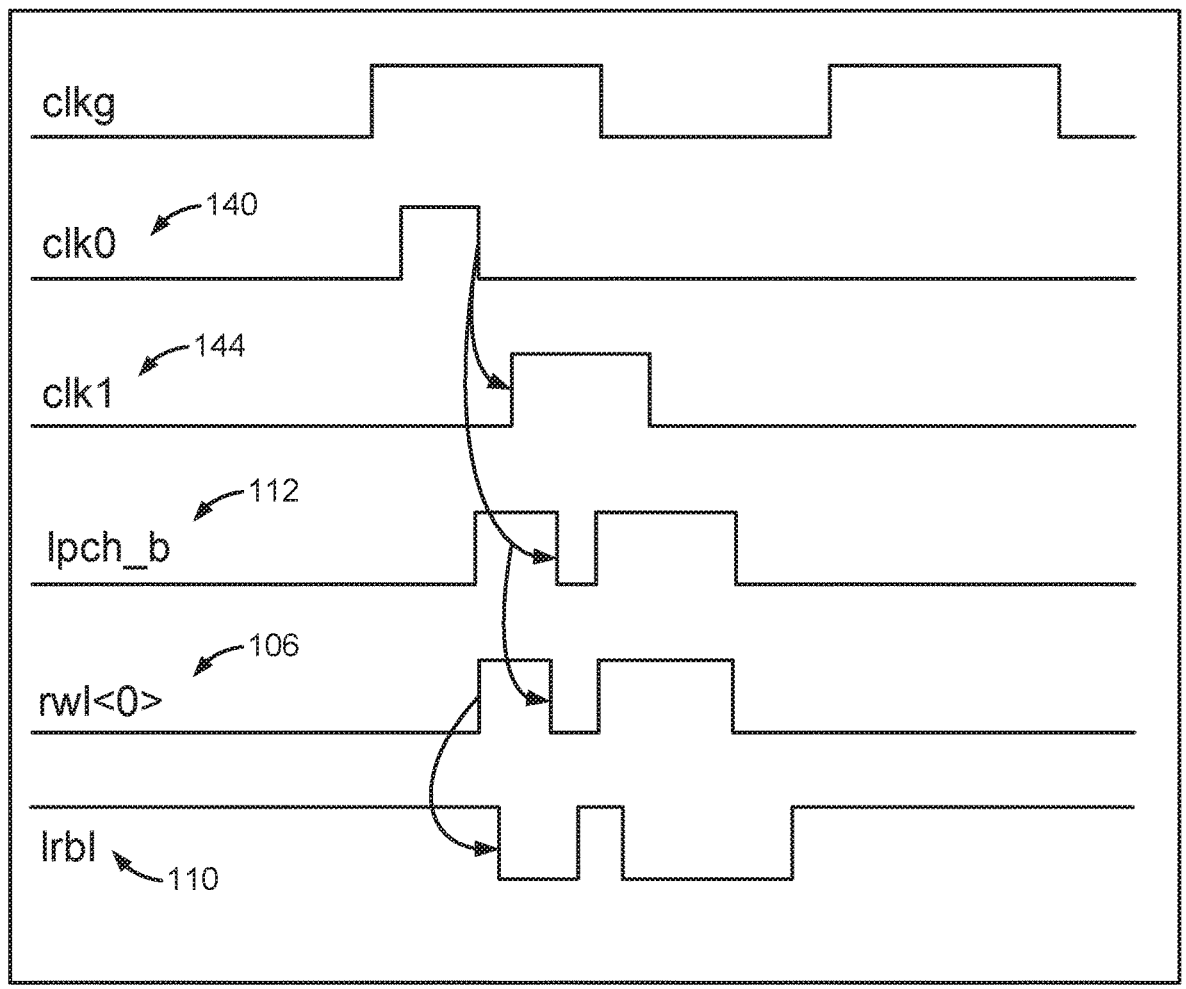

FIGS. 2-8 illustrate example timing diagrams for a register file circuit 100 read operation in accordance with some examples of the disclosure. As shown in FIG. 2, a read operation begins with the global clock signal 138 transitioning from a logical low to a logical high. The transitioning of the global clock signal 138 triggers a transition of the first clock signal 140 from a logical low to a logical high. As shown in FIG. 3, as the first clock signal 140 transitions to a logical high, the first bit control line 112 transitions to a logical high and the first read word line 106 transitions to a logical high with a slight delay. Next in FIG. 4, as the first clock signal 140 transitions back to a logical low, the first bit control line 112 transitions back to a logical low and the first read word line 106 transitions back to a logical low with a slight delay. In addition, the transition of the first read word line 106 to a logical high triggers a transition of the local read bitline 110 from a logical high to a logical low with a slight delay.

Figure 5:
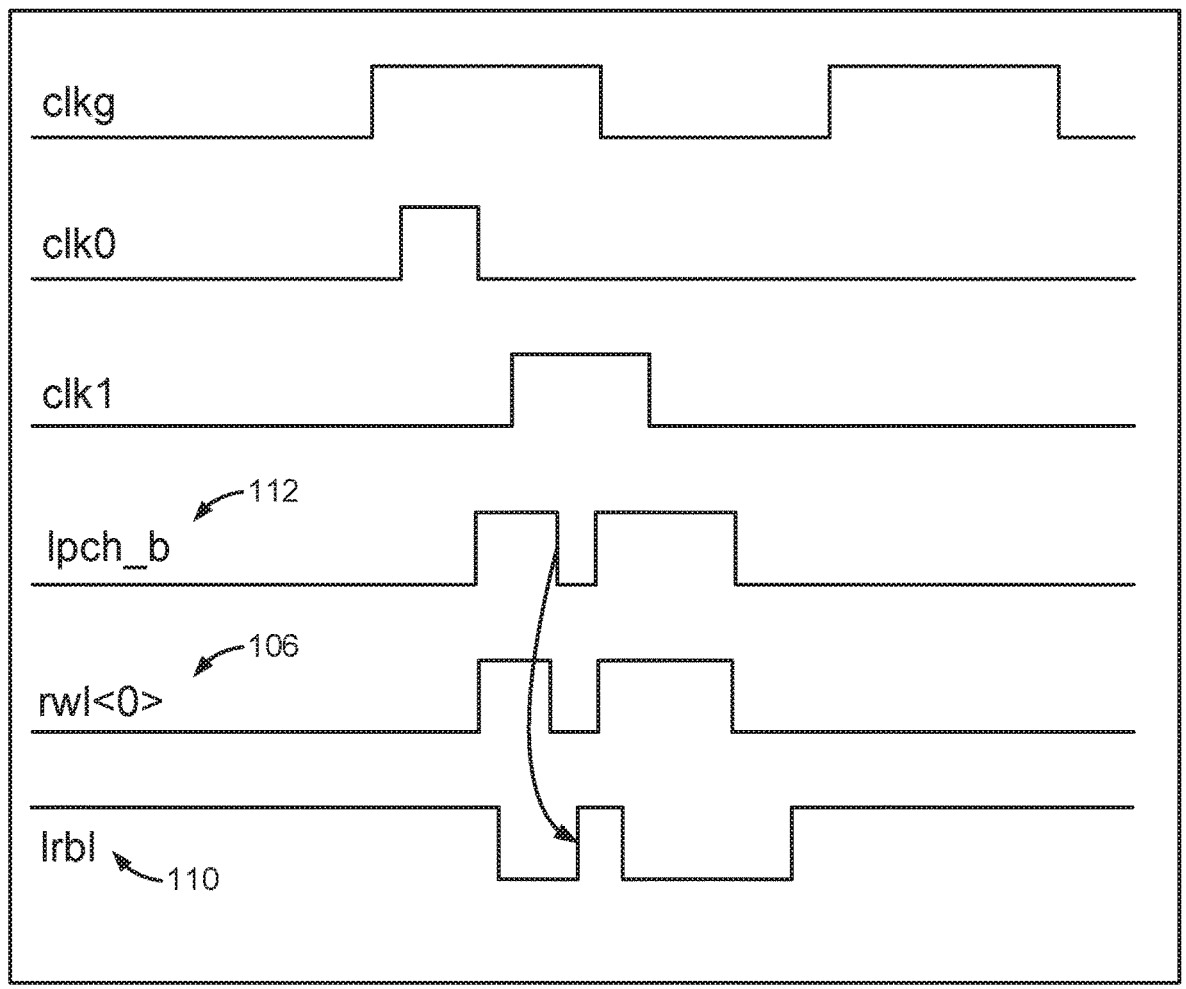
Figure 6:
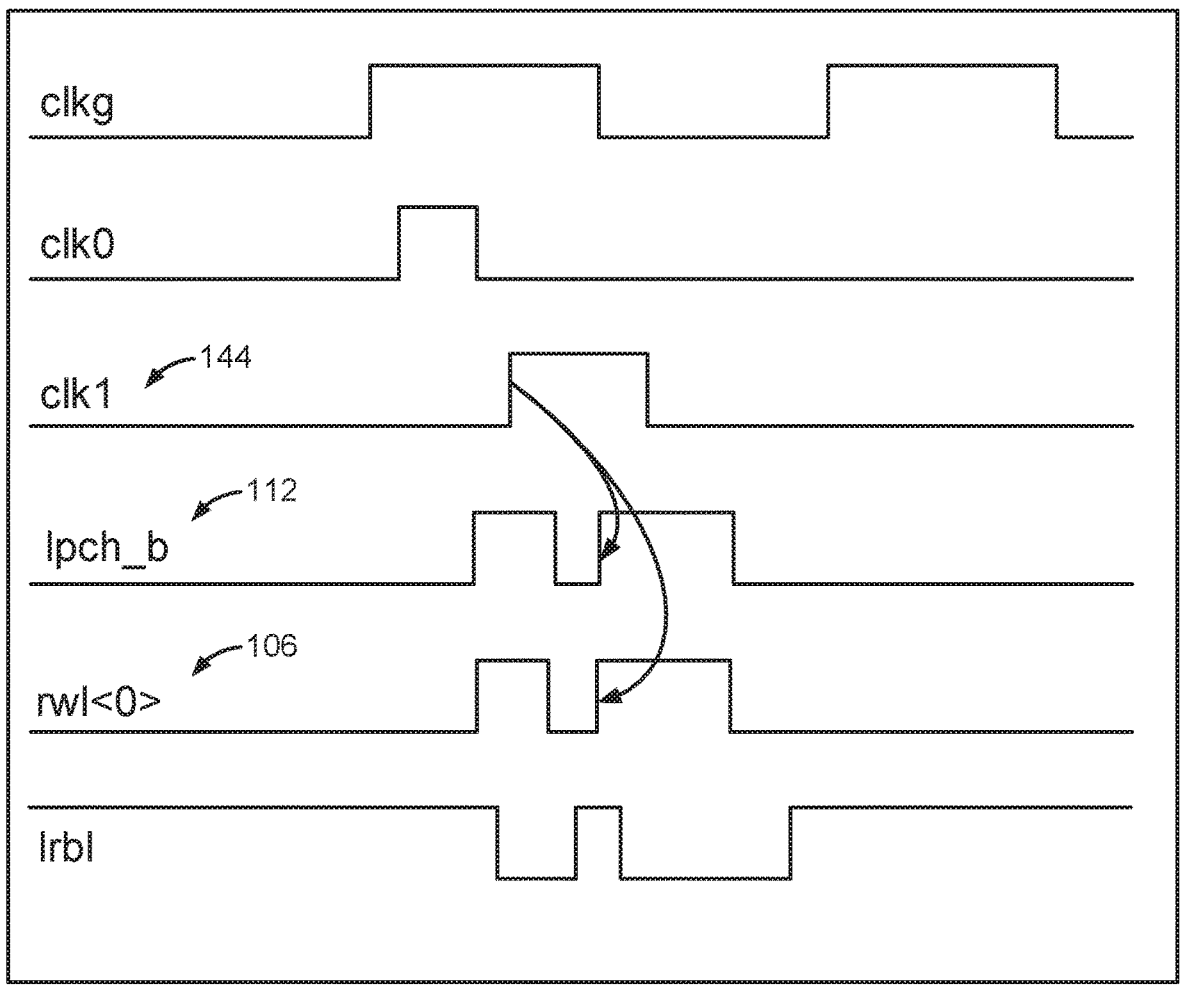
Figure 7:
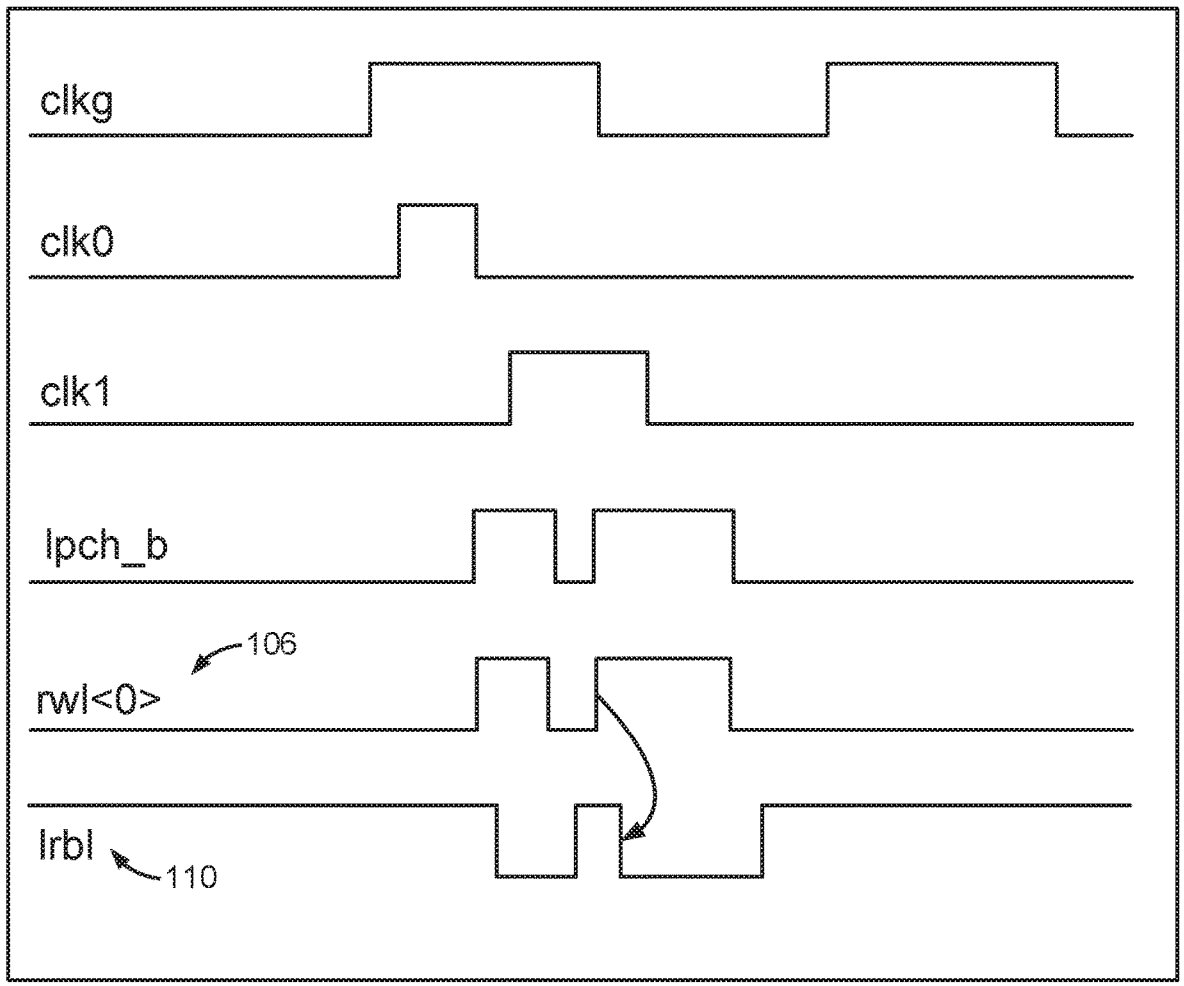
Figure 8:
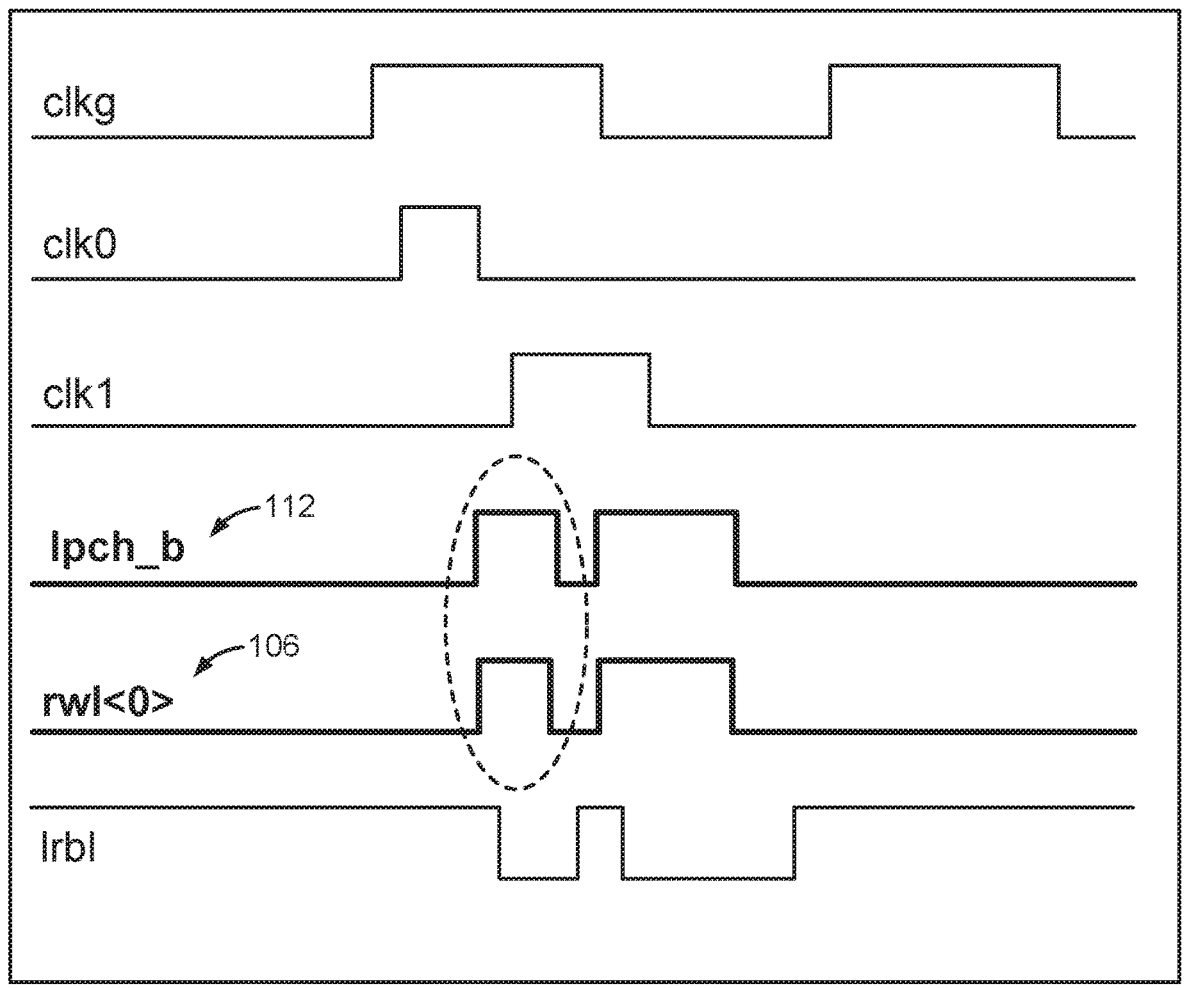

The read operation continues in FIG. 5 with the transition of the first bit control line 112 back to a logical low that triggers the transition of the local read bitline 110 back to a logical high with a slight delay. Next in FIG. 6, the transition of the second clock signal 144 to a logical high triggers a transition of the first bit control line 112 back to a logical high and transitions the first read word line 106 back to a logical high with a slight delay. As shown in FIG. 7, as the first read word line 106 transitions back to a logical high, the local read bitline 110 transitions back to a logical low with a slight delay. As shown in FIG. 8, the pulse width of the first transition of the first bit control line 112 and the first transition of the first read word line 106 are minimized to reduce the delay and allow a second read operation of a different memory cell before the global clock signal 138 transitions back to a logical low.

Figure 9A:
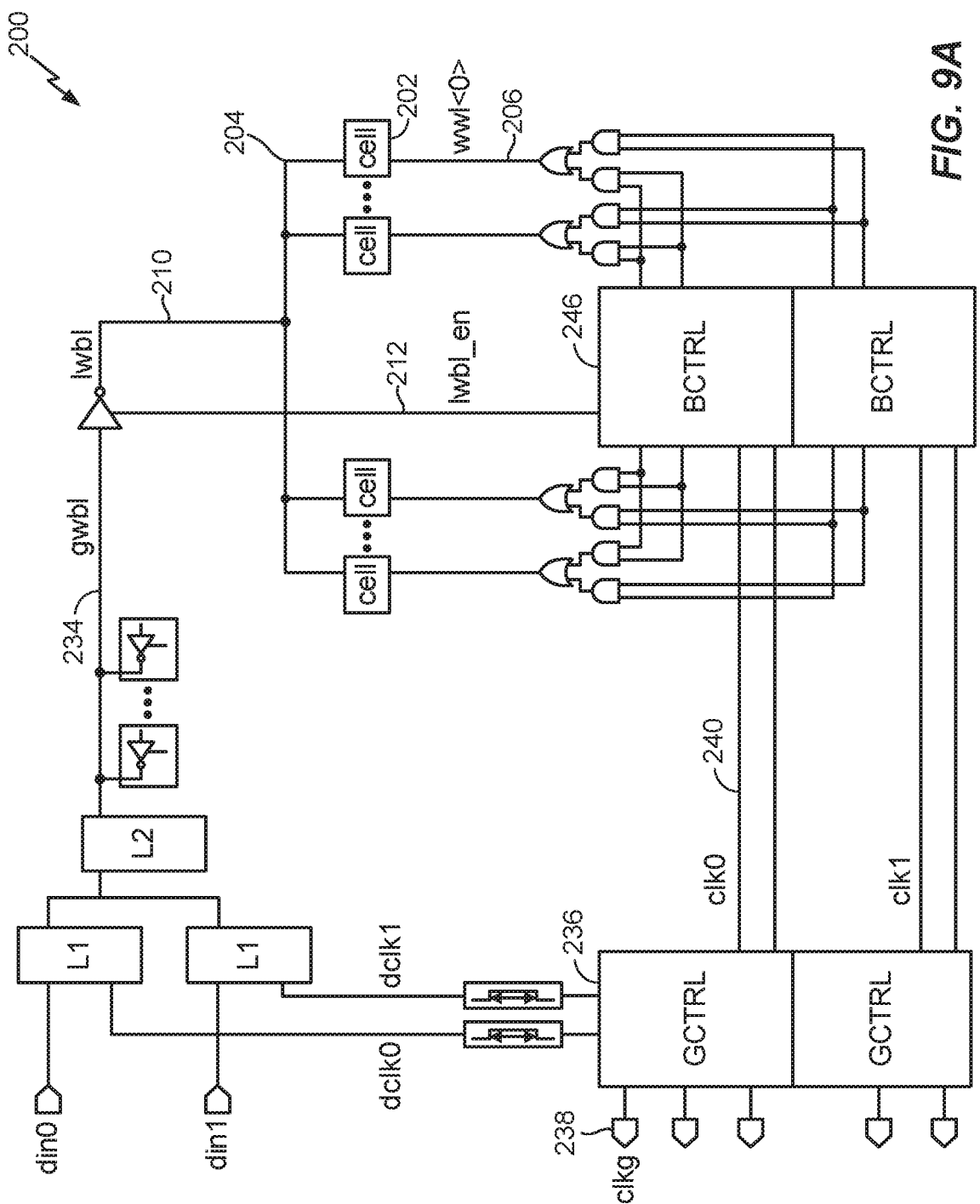
FIG. 9A illustrates an exemplary register file write circuit in accordance with some examples of the disclosure.

FIG. 9A illustrates an exemplary register file write circuit in accordance with some examples of the disclosure. As shown in FIG. 9A, a register file circuit 200 (e.g., register file circuit 100) may include a first memory cell 202 coupled to a first input 204 and a first write word line 206, a local write bitline 210, and a first enable local write bitline 212. The register file circuit 200 may be configured to select the first memory cell 202 for writing an input based on the local write bitline 210, the first enable local write bitline 212, and the first write word line 206. The register file circuit 200 may include a global write bitline 234 that is coupled to the local write bitline 210.

As shown in FIG. 9A, the register file circuit 200 may include more than one memory cell as well as additional components such as a first global control circuit 236 that inputs a global clock signal 238 and outputs a first clock signal 240, a first bit control circuit 246 that inputs the first clock signal 240 and outputs an enable signal on the first enable local write bitline 212. The first global control circuit 236 inputs a global clock signal 238 as well as a first address (e.g., r0_addr) and a first enable signal (e.g., r0_en) and, in conjunction with the first bit control circuit 246, decodes the first read address.

Figure 9B:
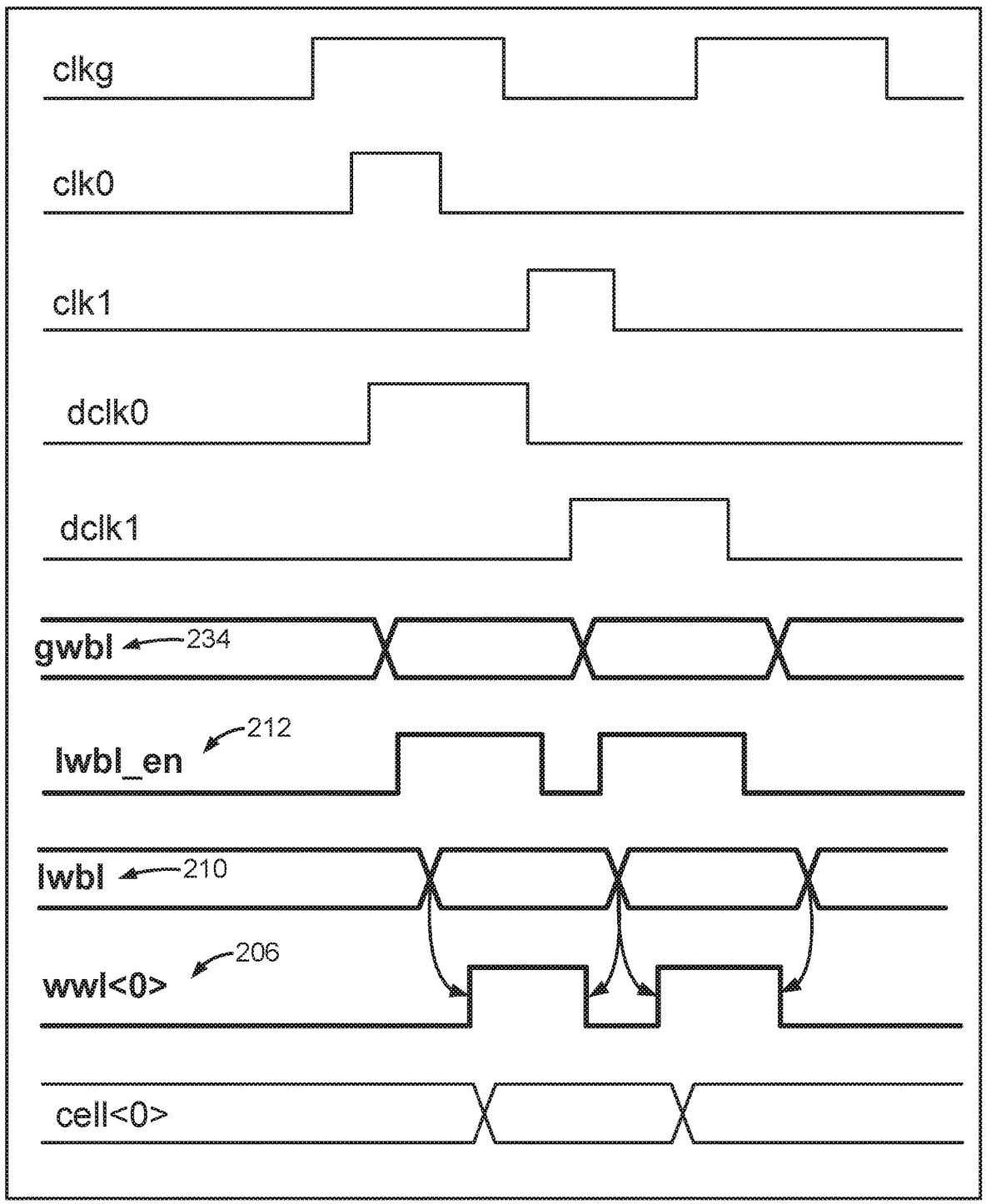
FIG. 9B illustrates an example timing diagram for a register file circuit write in accordance with some examples of the disclosure.

FIG. 9B illustrates an example timing diagram for a register file circuit write in accordance with some examples of the disclosure. As shown in FIG. 9B, as the global write line 234 transitions from a logical high to a logical low (and vice versa), the first enable local write bitline enable 212 transitions from a logical low to a logical high, and after a slight delay, the local write bitline 210 also transitions from a logical high to a logical low (and vice versa) along with a transition of the first write word line 206 from a logical low to a logical high and back again as shown.

Figure 10:
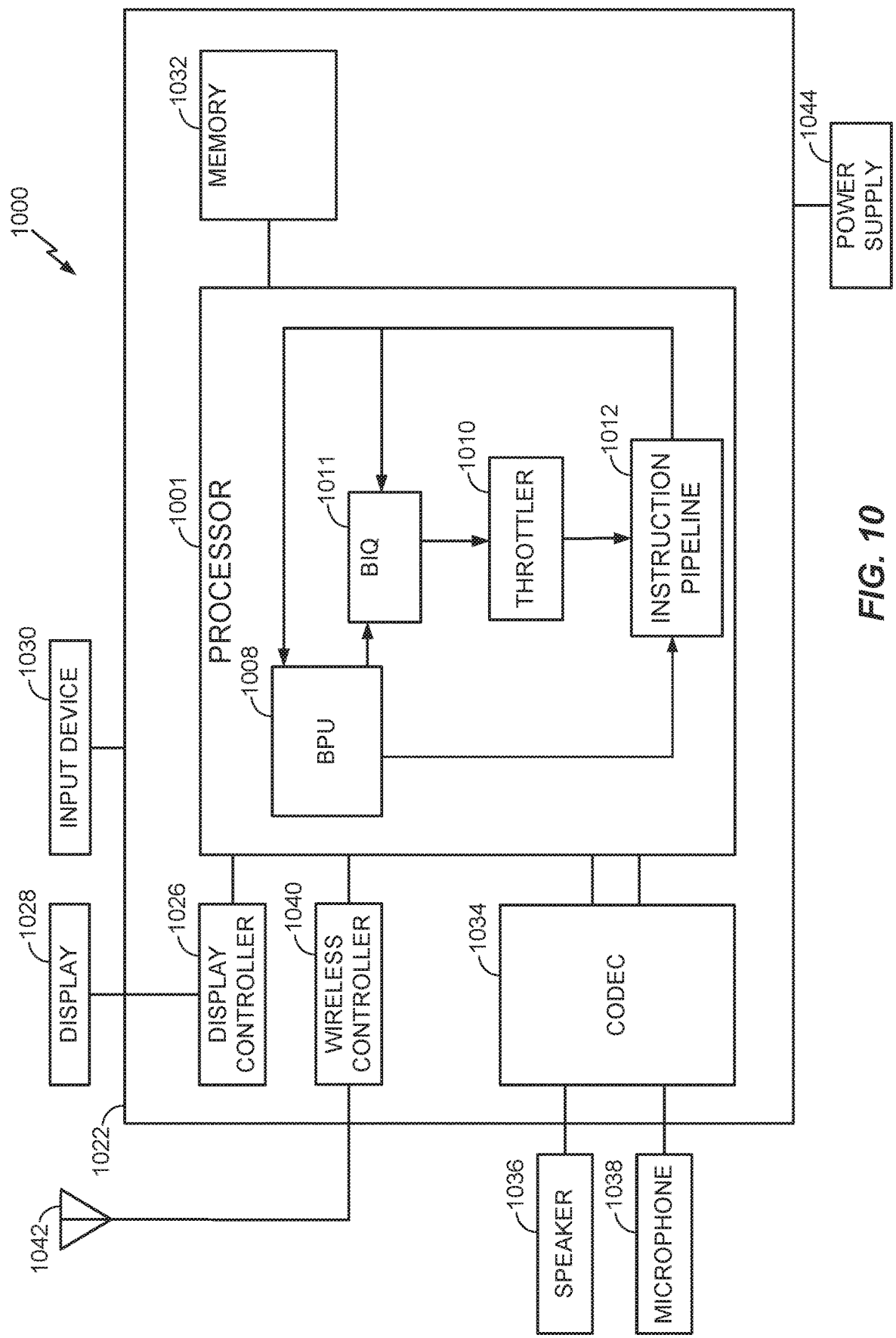
FIG. 10 illustrates an exemplary mobile device in accordance with some examples of the disclosure.

FIG. 10 illustrates an exemplary mobile device in accordance with some examples of the disclosure. Referring now to FIG. 10, a block diagram of a mobile device that is configured according to exemplary aspects is depicted and generally designated 1000. In some aspects, mobile device 1000 may be configured as a wireless communication device. As shown, mobile device 1000 includes processor 1001, which may be configured to implement the methods described herein in some aspects. Processor 1001 is shown to comprise instruction pipeline 1012, buffer processing unit (BPU) 1008, branch instruction queue (BIQ) 1011, and throttler 1010 as is well known in the art. Other well-known details (e.g., counters, entries, confidence fields, weighted sum, comparator, etc.) of these blocks have been omitted from this view of processor 1001 for the sake of clarity.

Processor 1001 may be communicatively coupled to memory 1032 over a link, which may be a die-to-die or chip-to-chip link. Mobile device 1000 also include display 1028 and display controller 1026, with display controller 1026 coupled to processor 1001 and to display 1028.

In some aspects, FIG. 10 may include coder/decoder (CODEC) 1034 (e.g., an audio and/or voice CODEC) coupled to processor 1001; speaker 1036 and microphone 1038 coupled to CODEC 1034; and wireless controller 1040 (which may include a modem) coupled to wireless antenna 1042 and to processor 1001.

In a particular aspect, where one or more of the above-mentioned blocks are present, processor 1001, display controller 1026, memory 1032, CODEC 1034, and wireless controller 1040 can be included in a system-in-package or system-on-chip device 1022. Input device 1030 (e.g., physical or virtual keyboard), power supply 1044 (e.g., battery), display 1028, input device 1030, speaker 1036, microphone 1038, wireless antenna 1042, and power supply 1044 may be external to system-on-chip device 1022 and may be coupled to a component of system-on-chip device 1022, such as an interface or a controller.

It should be noted that although FIG. 10 depicts a mobile device 1000, processor 1001 and memory 1032 may also be integrated into a set top box, a music player, a video player, an entertainment unit, a navigation device, a personal digital assistant (PDA), a fixed location data unit, a computer, a laptop, a tablet, a communications device, a mobile phone, or other similar devices.

Figure 11:
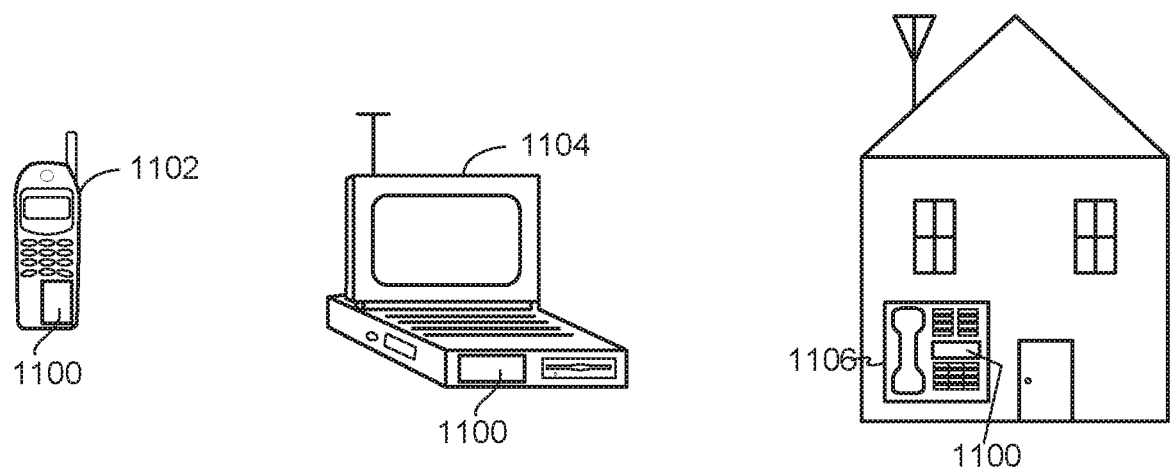
FIG. 11 illustrates various electronic devices that may be integrated with any of the aforementioned circuits and methods in accordance with some examples of the disclosure.

FIG. 11 illustrates various electronic devices that may be integrated with any of the aforementioned circuits and methods in accordance with some examples of the disclosure. For example, a mobile phone device 1102, a laptop computer device 1104, and a fixed location terminal device 1106 may include an integrated device 1100 as described herein. The integrated device 1100 may be, for example, any of the integrated circuits, dies, integrated devices, integrated device packages, integrated circuit devices, device packages, integrated circuit (IC) packages, package-on-package devices described herein. The devices 1102, 1104, 1106 illustrated in FIG. 11 are merely exemplary. Other electronic devices may also feature the integrated device 1100 including, but not limited to, a group of devices (e.g., electronic devices) that includes mobile devices, hand-held personal communication systems (PCS) units, portable data units such as personal digital assistants, global positioning system (GPS) enabled devices, navigation devices, set top boxes, music players, video players, entertainment units, fixed location data units such as meter reading equipment, communications devices, smartphones, tablet computers, computers, wearable devices, servers, routers, electronic devices implemented in automotive vehicles (e.g., autonomous vehicles), or any other device that stores or retrieves data or computer instructions, or any combination thereof.

It will be appreciated that various aspects disclosed herein can be described as functional equivalents to the structures, materials and/or devices described and/or recognized by those skilled in the art. For example, in one aspect, a register file circuit comprises: means for storing a first value (e.g., first memory cell 102) coupled to a first output and a first read word line; means for multiplexing (e.g., multiplexer circuit 108) coupled to the first output, a local read bitline, a first bit control line, and the first read word line and configured to select the first output based on the local read bitline and the first read word line; means for storing a second value (e.g., second memory cell 118) coupled to a second output and a second read word line; and wherein the means for multiplexing is coupled to the second output, a second bit control line, and the second read word line and configured to select the second output based on the local read bitline and the second read word line. It will be appreciated that the aforementioned aspects are merely provided as examples and the various aspects claimed are not limited to the specific references and/or illustrations cited as examples.

One or more of the components, processes, features, and/or functions illustrated in FIGS. 1-11 may be rearranged and/or combined into a single component, process, feature or function or incorporated in several components, processes, or functions. Additional elements, components, processes, and/or functions may also be added without departing from the disclosure. It should also be noted that FIGS. 1-11 and its corresponding description in the present disclosure is not limited to dies and/or ICs. In some implementations, FIGS. 1-11 and its corresponding description may be used to manufacture, create, provide, and/or produce integrated devices. In some implementations, a device may include a die, an integrated device, a die package, an integrated circuit (IC), a device package, and/or an integrated circuit (IC) package.

As used herein, the terms "user equipment" (or "UE"), "user device," "user terminal," "client device," "communication device," "wireless device," "wireless communications device," "handheld device," "mobile device," "mobile terminal," "mobile station," "handset," "access terminal," "subscriber device," "subscriber terminal," "subscriber station," "terminal," and variants thereof may interchangeably refer to any suitable mobile or stationary device that can receive wireless communication and/or navigation signals. These terms include, but are not limited to, a music player, a video player, an entertainment unit, a navigation device, a communications device, a smartphone, a personal digital assistant, a fixed location terminal, a tablet computer, a computer, a wearable device, a laptop computer, a server, an automotive device in an automotive vehicle, and/or other types of portable electronic devices typically carried by a person and/or having communication capabilities (e.g., wireless, cellular, infrared, short-range radio, etc.). These terms are also intended to include devices which communicate with another device that can receive wireless communication and/or navigation signals such as by short-range wireless, infrared, wireline connection, or other connection, regardless of whether satellite signal reception, assistance data reception, and/or position-related processing occurs at the device or at the other device. In addition, these terms are intended to include all devices, including wireless and wireline communication devices, that are able to communicate with a core network via a radio access network (RAN), and through the core network the UEs can be connected with external networks such as the Internet and with other UEs. Of course, other mechanisms of connecting to the core network and/or the Internet are also possible for the UEs, such as over a wired access network, a wireless local area network (WLAN) (e.g., based on IEEE 802.11, etc.) and so on. UEs can be embodied by any of a number of types of devices including but not limited to printed circuit (PC) cards, compact flash devices, external or internal modems, wireless or wireline phones, smartphones, tablets, tracking devices, asset tags, and so on. A communication link through which UEs can send signals to a RAN is called an uplink channel (e.g., a reverse traffic channel, a reverse control channel, an access channel, etc.). A communication link through which the RAN can send signals to UEs is called a downlink or forward link channel (e.g., a paging channel, a control channel, a broadcast channel, a forward traffic channel, etc.). As used herein the term traffic channel (TCH) can refer to an uplink/reverse or downlink/forward traffic channel.

The word "exemplary" is used herein to mean "serving as an example, instance, or illustration." Any details described herein as "exemplary" is not to be construed as advantageous over other examples. Likewise, the term "examples" does not mean that all examples include the discussed feature, advantage or mode of operation. Furthermore, a particular feature and/or structure can be combined with one or more other features and/or structures. Moreover, at least a portion of the apparatus described hereby can be configured to perform at least a portion of a method described hereby.

The terminology used herein is for the purpose of describing particular examples and is not intended to be limiting of examples of the disclosure. As used herein, the singular forms "a," "an," and "the" are intended to include the plural forms as well, unless the context clearly indicates otherwise.

It will be further understood that the terms "comprises," "comprising," "includes," and/or "including," when used herein, specify the presence of stated features, integers, actions, operations, elements, and/or components, but do not preclude the presence or addition of one or more other features, integers, actions, operations, elements, components, and/or groups thereof.

It should be noted that the terms "connected," "coupled," or any variant thereof, mean any connection or coupling, either direct or indirect, between elements, and can encompass a presence of an intermediate element between two elements that are "connected" or "coupled" together via the intermediate element.

Any reference herein to an element using a designation such as "first," "second," and so forth does not limit the quantity and/or order of those elements. Rather, these designations are used as a convenient method of distinguishing between two or more elements and/or instances of an element. Also, unless stated otherwise, a set of elements can comprise one or more elements.

Those skilled in the art will appreciate that information and signals may be represented using any of a variety of different technologies and techniques. For example, data, instructions, commands, information, signals, bits, symbols, and chips that may be referenced throughout the above description may be represented by voltages, currents, electromagnetic waves, magnetic fields or particles, optical fields or particles, or any combination thereof.

The various illustrative logical blocks, modules, and circuits described in connection with the aspects disclosed herein may be implemented or performed with a general purpose processor, a digital signal processor (DSP), an application specific integrated circuit (ASIC), a field programmable gate array (FPGA) or other programmable logic device, discrete gate or transistor logic, discrete hardware components, or any combination thereof designed to perform the functions described herein. A general purpose processor may be a microprocessor, but in the alternative, the processor may be any conventional processor, controller, microcontroller, or state machine. A processor may also be implemented as a combination of computing devices (e.g., a combination of a DSP and a microprocessor, a plurality of microprocessors, one or more microprocessors in conjunction with a DSP core, or other such configurations). Additionally, these sequence of actions described herein can be considered to be incorporated entirely within any form of computer-readable storage medium having stored therein a corresponding set of computer instructions that upon execution would cause an associated processor to perform the functionality described herein. Thus, the various aspects of the disclosure may be incorporated in a number of different forms, all of which have been contemplated to be within the scope of the claimed subject matter. In addition, for each of the examples described herein, the corresponding form of any such examples may be described herein as, for example, "logic configured to" perform the described action.

Nothing stated or illustrated depicted in this application is intended to dedicate any component, action, feature, benefit, advantage, or equivalent to the public, regardless of whether the component, action, feature, benefit, advantage, or the equivalent is recited in the claims.

Further, those of skill in the art will appreciate that the various illustrative logical blocks, modules, circuits, and algorithm actions described in connection with the examples disclosed herein may be implemented as electronic hardware, computer software, or combinations of both. To clearly illustrate this interchangeability of hardware and software, various illustrative components, blocks, modules, circuits, and actions have been described above generally in terms of their functionality. Whether such functionality is implemented as hardware or software depends upon the particular application and design constraints imposed on the overall system. Skilled artisans may implement the described functionality in varying ways for each particular application, but such implementation decisions should not be interpreted as causing a departure from the scope of the present disclosure.

The methods, sequences and/or algorithms described in connection with the examples disclosed herein may be incorporated directly in hardware, in a software module executed by a processor, or in a combination of the two. A software module may reside in RAM memory, flash memory, ROM memory, EPROM memory, EEPROM memory, registers, hard disk, a removable disk, a CD-ROM, or any other form of storage medium known in the art including non-transitory types of memory or storage mediums. An exemplary storage medium is coupled to the processor such that the processor can read information from, and write information to, the storage medium. In the alternative, the storage medium may be integral to the processor.

Although some aspects have been described in connection with a device, it goes without saying that these aspects also constitute a description of the corresponding method, and so a block or a component of a device should also be understood as a corresponding method action or as a feature of a method action. Analogously thereto, aspects described in connection with or as a method action also constitute a description of a corresponding block or detail or feature of a corresponding device. Some or all of the method actions can be performed by a hardware apparatus (or using a hardware apparatus), such as, for example, a microprocessor, a programmable computer or an electronic circuit. In some examples, some or a plurality of the most important method actions can be performed by such an apparatus.

In the detailed description above it can be seen that different features are grouped together in examples. This manner of disclosure should not be understood as an intention that the claimed examples have more features than are explicitly mentioned in the respective claim. Rather, the disclosure may include fewer than all features of an individual example disclosed. Therefore, the following claims should hereby be deemed to be incorporated in the description, wherein each claim by itself can stand as a separate example. Although each claim by itself can stand as a separate example, it should be noted that-although a dependent claim can refer in the claims to a specific combination with one or a plurality of claims—other examples can also encompass or include a combination of said dependent claim with the subject matter of any other dependent claim or a combination of any feature with other dependent and independent claims. Such combinations are proposed herein, unless it is explicitly expressed that a specific combination is not intended. Furthermore, it is also intended that features of a claim can be included in any other independent claim, even if said claim is not directly dependent on the independent claim.

It should furthermore be noted that methods, systems, and apparatus disclosed in the description or in the claims can be implemented by a device comprising means for performing the respective actions of this method.

Furthermore, in some examples, an individual action can be subdivided into a plurality of sub-actions or contain a plurality of sub-actions. Such sub-actions can be contained in the disclosure of the individual action and be part of the disclosure of the individual action.

While the foregoing disclosure shows illustrative examples of the disclosure, it should be noted that various changes and modifications could be made herein without departing from the scope of the disclosure as defined by the appended claims. The functions and/or actions of the method claims in accordance with the examples of the disclosure described herein need not be performed in any particular order. Additionally, well-known elements will not be described in detail or may be omitted so as to not obscure the relevant details of the aspects and examples disclosed herein. Furthermore, although elements of the disclosure may be described or claimed in the singular, the plural is contemplated unless limitation to the singular is explicitly stated.

What is claimed is:

1. A register file circuit comprising:
    a first memory cell coupled to a first output and a first read word line;
    a multiplexer circuit coupled to the first output, a local read bitline, a first bit control line, and the first read word line, the multiplexer circuit configured to select the first output based on the local read bitline and the first read word line;
    wherein the multiplexer circuit comprises a first transistor coupled to the local read bitline at a source of the first transistor and the first read word line at a gate of the first transistor, and a second transistor coupled to the first bit control line at a gate of the second transistor, a ground at a drain of the second transistor, and a drain of the first transistor at a source of the second transistor;
    a latch coupled to the multiplexer circuit, the latch configured to selectively input the first output;
    a first read inverter coupled to the multiplexer circuit, the inverter configured to selectively input the first output;
    a second memory cell coupled to a second output and a second read word line;
    wherein the multiplexer circuit is coupled to the second output, a second bit control line, and the second read word line; the multiplexer circuit configured to select the second output based on the local read bitline and the second read word line;
    wherein the multiplexer circuit comprises a third transistor coupled to the local read bitline at a source of the third transistor and the second read word line at a gate of the third transistor, and a fourth transistor coupled to a second bit control line at a gate of the fourth transistor, a ground at a drain of the fourth transistor, and a drain of the third transistor at a source of the fourth transistor; and
    wherein the multiplexer circuit is coupled to the latch and a second global read bitline, the latch is coupled to a first global read bitline, and the multiplexer circuit is configured to selectively couple the first output to the latch and selectively couple the second output to the second global read bitline in a same clock cycle.

2. The register file circuit of claim 1, wherein the first memory cell comprises a first inverter coupled to a second inverter, a third inverter coupled to the first inverter and the second inverter, a first passgate coupled to the first inverter, the second inverter, and the third inverter, a second passgate coupled to the first passgate, the first inverter, and the second inverter.

3. The register file circuit of claim 2, wherein an output of the first inverter is coupled to an input of the second inverter and an input of the third inverter, and wherein an input of the first inverter is coupled to an output of the second inverter.

4. The register file circuit of claim 3, wherein the first inverter and the second inverter are configured to store a logical value of one or zero.

5. The register file circuit of claim 4, wherein the first passgate and the second passgate are configured to input the logical value and wherein the first passgate, the second passgate, and the third inverter are configured to output the logical value.

6. The register file circuit of claim 1, wherein the register file circuit is incorporated into a device selected from the group consisting of a music player, a video player, an entertainment unit, a navigation device, a communications device, a mobile device, a mobile phone, a smartphone, a personal digital assistant, a fixed location terminal, a tablet computer, a computer, a wearable device, a laptop computer, a server, and a device in an automotive vehicle.

7. A register file circuit comprising:
    means for storing a first value coupled to a first output and a first read word line;
    means for multiplexing coupled to the first output, a local read bitline, a first bit control line, and the first read word line, the means for multiplexing configured to select the first output based on the local read bitline and the first read word line;
    wherein the means for multiplexing comprises a first transistor coupled to the local read bitline at a source of the first transistor and the first read word line at a gate of the first transistor, and a second transistor coupled to the first bit control line at a gate of the second transistor, a ground at a drain of the second transistor, and a drain of the first transistor at a source of the second transistor;
    a latch coupled to the means for multiplexing, the latch configured to selectively input the first output;
    a first read inverter coupled to the means for multiplexing, the inverter configured to selectively input the first output;
    means for storing a second value coupled to a second output and a second read word line;
    wherein the means for multiplexing is coupled to the second output, a second bit control line, and the second read word line; the means for multiplexing configured to select the second output based on the local read bitline and the second read word line;
    wherein the means for multiplexing comprises a third transistor coupled to the local read bitline at a source of the third transistor and the second read word line at a gate of the third transistor, and a fourth transistor coupled to a second bit control line at a gate of the fourth transistor, a ground at a drain of the fourth transistor, and a drain of the third transistor at a source of the fourth transistor; and
    wherein the means for multiplexing is coupled to the latch and a second global read bitline, the latch is coupled to a first global read bitline, and the means for multiplexing is configured to selectively couple the first output to the latch and selectively couple the second output to the second global read bitline in a same clock cycle.

8. The register file circuit of claim 7, wherein the means for storing the first value comprises a first inverter coupled to a second inverter, a third inverter coupled to the first inverter and the second inverter, a first passgate coupled to the first inverter, the second inverter, and the third inverter, a second passgate coupled to the first passgate, the first inverter, and the second inverter.

9. The register file circuit of claim 8, wherein an output of the first inverter is coupled to an input of the second inverter and an input of the third inverter, and wherein an input of the first inverter is coupled to an output of the second inverter.

10. The register file circuit of claim 9, wherein the first inverter and the second inverter are configured to store a logical value of one or zero.

11. The register file circuit of claim 10, wherein the first passgate and the second passgate are configured to input the logical value and wherein the first passgate, the second passgate, and the third inverter are configured to output the logical value.

12. The register file circuit of claim 7, wherein the register file circuit is incorporated into a device selected from the group consisting of a music player, a video player, an entertainment unit, a navigation device, a communications device, a mobile device, a mobile phone, a smartphone, a personal digital assistant, a fixed location terminal, a tablet computer, a computer, a wearable device, a laptop computer, a server, and a device in an automotive vehicle.

13. A register file circuit comprising:
a first memory cell coupled to a first output, a first read word line, a first input, and a first write word line; the first output coupled to a local read bitline and the first input coupled to a local write bitline;
a multiplexer circuit coupled to the first output, the local read bitline, a first bit control line, and the first read word line, the multiplexer circuit configured to select the first output based on the local read bitline and the first read word line;
wherein the multiplexer circuit comprises a first transistor coupled to the local read bitline at a source of the first transistor and the first read word line at a gate of the first transistor, and a second transistor coupled to the first bit control line at a gate of the second transistor, a ground at a drain of the second transistor, and a drain of the first transistor at a source of the second transistor;
a latch coupled to the multiplexer circuit, the latch configured to selectively input the first output;
a first read inverter coupled to the multiplexer circuit, the inverter configured to selectively input the first output;
a second memory cell coupled to a second output, a second read word line, a second input, and a second write word line; the second output coupled to the local read bitline and the second input coupled to a local write bitline;
wherein the multiplexer circuit is coupled to the second output, a second bit control line, and the second read word line; the multiplexer circuit configured to select the second output based on the local read bitline and the second read word line;
wherein the multiplexer circuit comprises a third transistor coupled to the local read bitline at a source of the third transistor and the second read word line at a gate of the third transistor, and a fourth transistor coupled to a second bit control line at a gate of the fourth transistor, a ground at a drain of the fourth transistor, and a drain of the third transistor at a source of the fourth transistor; and
wherein the multiplexer circuit is coupled to the latch and a second global read bitline, the latch is coupled to a first global read bitline, and the multiplexer circuit is configured to selectively couple the first output to the latch and selectively couple the second output to the second global read bitline in a same clock cycle.

14. The register file circuit of claim 13, wherein the first memory cell comprises a first inverter coupled to a second inverter, a third inverter coupled to the first inverter and the second inverter, a first passgate coupled to the first inverter, the second inverter, and the third inverter, a second passgate coupled to the first passgate, the first inverter, and the second inverter.

15. The register file circuit of claim 14, wherein an output of the first inverter is coupled to an input of the second inverter and an input of the third inverter, and wherein an input of the first inverter is coupled to an output of the second inverter.

16. The register file circuit of claim 15, wherein the first inverter and the second inverter are configured to store a logical value of one or zero.

17. The register file circuit of claim 16, wherein the first passgate and the second passgate are configured to input the logical value and wherein the first passgate, the second passgate, and the third inverter are configured to output the logical value.

18. The register file circuit of claim 13, wherein the register file circuit is incorporated into a device selected from the group consisting of a music player, a video player, an entertainment unit, a navigation device, a communications device, a mobile device, a mobile phone, a smartphone, a personal digital assistant, a fixed location terminal, a tablet computer, a computer, a wearable device, a laptop computer, a server, and a device in an automotive vehicle.

19. A register file circuit comprising:
means for storing a first value coupled to a first output, a first read word line, a first input, and a first write word line; the first output coupled to a local read bitline and the first input coupled to a local write bitline;
means for multiplexing coupled to the first output, a local read bitline, a first bit control line, and the first read word line, the means for multiplexing configured to select the first output based on the local read bitline and the first read word line;
wherein the means for multiplexing comprises a first transistor coupled to the local read bitline at a source of the first transistor and the first read word line at a gate of the first transistor, and a second transistor coupled to the first bit control line at a gate of the second transistor, a ground at a drain of the second transistor, and a drain of the first transistor at a source of the second transistor;
a latch coupled to the means for multiplexing, the latch configured to selectively input the first output;
a first read inverter coupled to the means for multiplexing, the inverter configured to selectively input the first output;
means for storing a second value coupled to a second output, a second read word line, a second input, and a second write word line; the second output coupled to the local read bitline and the second input coupled to the local write bitline;
wherein the means for multiplexing is coupled to the second output, a second bit control line, and the second read word line; the means for multiplexing configured to select the second output based on the local read bitline and the second read word line;
wherein the means for multiplexing comprises a third transistor coupled to the local read bitline at a source of the third transistor and the second read word line at a gate of the third transistor, and a fourth transistor coupled to a second bit control line at a gate of the fourth transistor, a ground at a drain of the fourth transistor, and a drain of the third transistor at a source of the fourth transistor; and wherein the means for multiplexing is coupled to the latch and a second global read bitline, the latch is coupled to a first global read bitline, and the means for multiplexing is configured to selectively couple the first output to the latch and selectively couple the second output to the second global read bitline in a same clock cycle.

20. The register file circuit of claim 19, wherein the means for storing the first value comprises a first inverter coupled to a second inverter, a third inverter coupled to the first inverter and the second inverter, a first passgate coupled to the first inverter, the second inverter, and the third inverter, a second passgate coupled to the first passgate, the first inverter, and the second inverter.

21. The register file circuit of claim 20, wherein an output of the first inverter is coupled to an input of the second inverter and an input of the third inverter, and wherein an input of the first inverter is coupled to an output of the second inverter.

22. The register file circuit of claim 21, wherein the first inverter and the second inverter are configured to store a logical value of one or zero.

23. The register file circuit of claim 22, wherein the first passgate and the second passgate are configured to input the logical value and wherein the first passgate, the second passgate, and the third inverter are configured to output the logical value.

24. The register file circuit of claim 19, wherein the register file circuit is incorporated into a device selected from the group consisting of a music player, a video player, an entertainment unit, a navigation device, a communications device, a mobile device, a mobile phone, a smartphone, a personal digital assistant, a fixed location terminal, a tablet computer, a computer, a wearable device, a laptop computer, a server, and a device in an automotive vehicle.

* * * * *